United States Patent
Bajt et al.

(10) Patent No.: US 6,867,149 B2
(45) Date of Patent: Mar. 15, 2005

(54) GROWTH OF MULTI-COMPONENT ALLOY FILMS WITH CONTROLLED GRADED CHEMICAL COMPOSITION ON SUB-NANOMETER SCALE

(75) Inventors: Sasa Bajt, Livermore, CA (US); Stephen P. Vernon, Pleasanton, CA (US)

(73) Assignee: EUV Limited Liability Corporation, Santa Clara, CA (US)

(*) Notice: Subject to any disclaimer, the term of this patent is extended or adjusted under 35 U.S.C. 154(b) by 107 days.

(21) Appl. No.: 10/256,324

(22) Filed: Sep. 27, 2002

(65) Prior Publication Data
US 2004/0063226 A1 Apr. 1, 2004

(51) Int. Cl.[7] .............................................. H01L 21/31
(52) U.S. Cl. ..................... 438/763; 438/758; 427/78; 427/124; 427/585; 205/149; 205/157; 205/176
(58) Field of Search ........................ 700/121; 427/78, 427/123, 124, 126.1, 455, 546, 555; 438/758, 763; 205/149, 157, 176

(56) References Cited

U.S. PATENT DOCUMENTS 4,331,702 A * 5/1982 Hieber et al. ............... 700/121
6,162,488 A * 12/2000 Gevelber et al. ......... 427/248.1

* cited by examiner

*Primary Examiner*—Leo Picard
*Assistant Examiner*—Charles Kasenge
(74) *Attorney, Agent, or Firm*—John P. Wooldridge; Alan H. Thompson

(57) ABSTRACT

The chemical composition of thin films is modulated during their growth. A computer code has been developed to design specific processes for producing a desired chemical composition for various deposition geometries. Good agreement between theoretical and experimental results was achieved.

19 Claims, 6 Drawing Sheets

GROWTH OF MULTI-COMPONENT ALLOY FILMS WITH CONTROLLED GRADED CHEMICAL COMPOSITION ON SUB-NANOMETER SCALE

The United States Government has rights in this invention pursuant to Contract No. W-7405-ENG48 between the United States Department of Energy and the University of California for the operation of Lawrence Livermore National Laboratory.

BACKGROUND OF THE INVENTION

1. Field of the Invention

The present invention relates to techniques for producing thin films on substrates by vapor deposition processes, and more specifically, it relates to a method for producing multi-component thin films with precise gradients in chemical composition in either or both the vertical and horizontal directions.

2. Description of Related Art

Multilayer coatings are formed by depositing alternating layers of two (or more) materials of different refractive index. In the ideal case, these two materials form stable structures with sharp, abrupt interfaces. The profile of an ideal interface can be represented by a step function. The chemical composition changes abruptly in the vertical direction (the growth direction) from one layer to the other. Realistically however, because of the diffusion of one material into the other, the interfaces are never abrupt and can be better described as a chemically graded region where the concentration of the individual constituents varies continuously. The chemical gradient of the interface depends on growth parameters, which are deposition process specific, and hard to control.

It is desirable to form a controlled chemical gradient in multilayer coatings. Chemical gradients can be formed in either the vertical direction (e.g., within one layer, on the interface between two layers, etc.) or in the lateral direction (e.g., varying the chemical composition across the surface). However, this is very difficult, especially when the gradient has to be formed with sub-nanometer thickness (vertical case) or has to vary precisely across large areas (lateral case).

SUMMARY OF THE INVENTION

It is an object of the present invention to provide a method for producing multi-component thin films with precise gradients in chemical composition using physical vapor deposition (PVD) and chemical vapor deposition (CVD) processes.

It is another object to control the chemical composition in either or both the vertical (growth) direction as well as in the horizontal (lateral) direction.

These and other objects will be apparent based on the disclosure herein.

The invention is a method for fabricating films with chemically modulated composition wherein the composition gradients are generated with a compositionally modulated, tiled target designed using a predictive thin film deposition simulation program. For example, consider a sputtering source with a tiled target that consists of two different materials, A and B. Further assume that the spatial distribution of the sputtered effluent from material A and material B is known as a function of the relevant deposition variables, including the spatial and angular distribution of the sputtered flux as a function of pressure, source voltage, source current, etc. In this case, the fractional concentration of material A and B within the sputtered effluent will be a function of the geometry of the target. For example, the sputtered effluent immediately above a tile of material A will be rich in A; similarly, the sputtered effluent immediately above a tile of material B will be rich in B. Therefore, the spatial variation in the chemical composition of the sputtered flux can be controlled and adjusted via appropriate design of the sputtering target. A computer program, which numerically integrates over the sputtering target is used to calculate the chemical composition (and deposition rate) of the sputtered effluent within the region of space used to coat the substrate.

For processes that do not require relative substrate-target motion or where only lateral composition gradients are desired it is sufficient to restrict the simulations to the surface that contains the substrate. The surface would planar for a flat substrate, spherical for a spherical lens or mirror, etc. The predicted chemical composition is compared to the desired result and the simulated target geometry is modified. This process is repeated until the desired composition gradient is obtained, thereby indicating the optimum design for the sputtering target.

When relative motion of the source and substrate are included a much broader variety of composition gradients may be produced. In such cases, the simulation program must track the relative position of each point on the substrate relative to the sputtering target and integrate both over the sputtering target and the substrate trajectory to compute the chemical composition of the film as a function of the position on the substrate and the film thickness. Here, the combination of target design and substrate motion permit the production of films with lateral and vertical composition gradients. U.S. Pat. No. 6,010,600, incorporated herein by reference, discloses an approach to producing spatially, but not chemically, tailored thin films by accelerating the substrate in the region containing the boundary of the deposition flux. In the present invention, an iterative process is employed wherein the target geometry and substrate equation of motion are sequentially adjusted to improve the correspondence between the simulation predictions and the desired composition gradients and select the optimum design for the sputtering target. Potential applications include growth of uniform alloy layers, growth of chemically graded alloy layers, and the growth of chemically non-uniform layers within the growth plane (across the optic).

DETAILED DESCRIPTION OF THE INVENTION

The invention is a method for the control of the local chemical composition of a thin layer and the fabrication of desired chemical gradient (composition change) in either or both of the vertical (growth) direction or in the lateral direction (across the substrate). Below, an example is shown of the implementation of this concept in magnetron sputter deposition. The method can be employed in other thin film deposition techniques, including both PVD and CVD processes. In addition to modulating the spatial distribution of the thickness of thin films (as described in U.S. Pat. Ser. No. 09/454,673, titled "Method And System For Producing Sputtered Thin Films With Sub-Angstrom Thickness Uniformity Or Custom Thickness Gradients", incorporated herein by reference), one can now also modulate chemical composition of thin films during their growth.

The idea is to use a sputtering target that consists of pieces of different materials (A and B, for example) and design it in such a way that you obtain the desired chemical modulation of elements A and B or an AB alloy in the film. By modulating the velocity (time) of the substrate over the sputtering target, it is then possible to achieve a custom gradient of AB alloy, for example. The chemical modulation can then be predicted in advance on a specific example as shown below.

Figure 1:
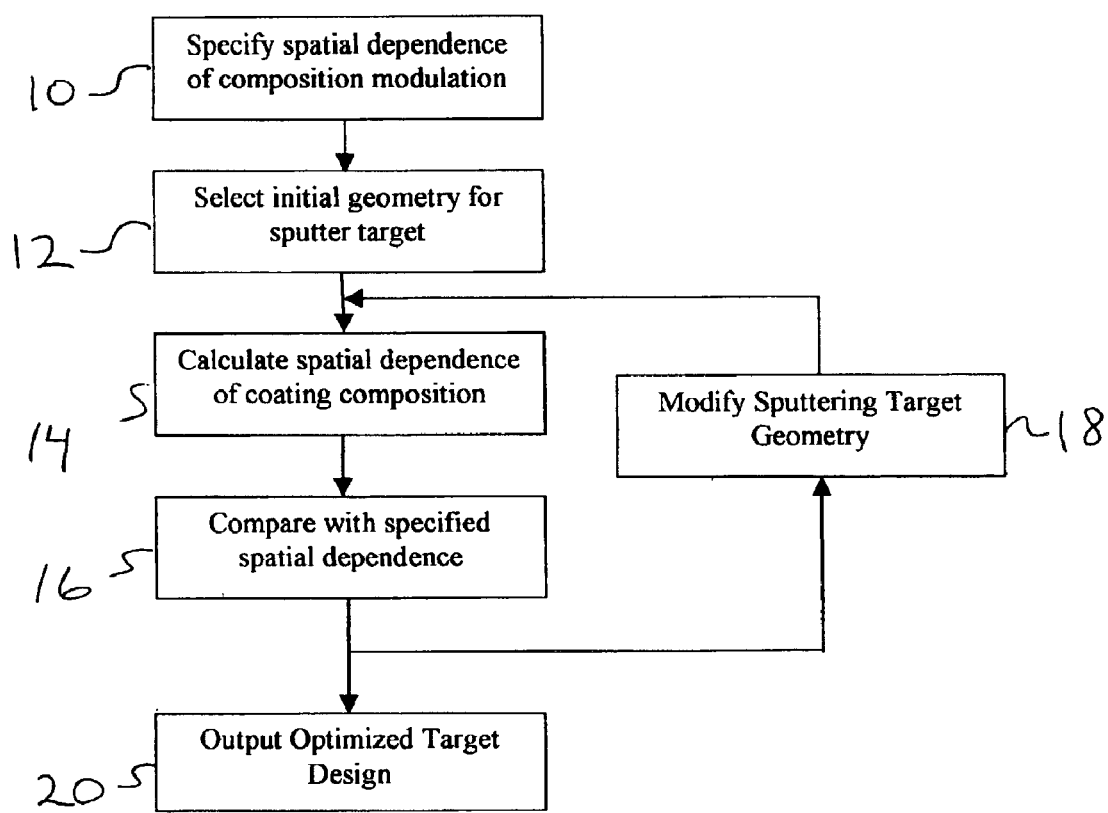
FIG. 1 shows an embodiment of the process flow chart of the present invention.

The computer program was written in the IDL software program (Interactive Data Language), which is a Registered Trademark of Research Systems Inc. The process flow chart is discussed with reference to FIG. 1. The first step is to specify the spatial dependence of the composition modulation (10). An initial geometry is then selected for the sputter target (12). Next, using the computer program, a calculation is made of the spatial dependence of the coating composition (14) that would be produced with the initial sputter target geometry. This calculation is then compared (16) with the specified spatial dependence of the composition modulation. The sputtering target geometry is then modified (18) and steps 14 and 16 and 18 are repeated until the target design is optimized 20.

Lets assume that the target surface lies in the x-y plane (z=0) and an ion beam with a spatial dependent current strikes the target surface. The current at each point on the target surface is described by the function I(x,y). Statistically, the sputtered flux per ion is represented by the sputter yield Y. Y can depend on several factors. For illustrative purposes assume that Y depends only on the angle between the sputtered particles trajectory and the target normal, e.g., $Y=Y(\theta)$. Therefore the sputtered flux at a point $r'=(x',y',z')$ due to erosion of the target surface at $r=(x,y,0)$ is $$F(x,y,0,x',y',z')=I(x,y,0)Y(\theta)/(r-r')^2$$

where $$\theta = \cos^{-1}\left[\frac{\vec{r}' \cdot \vec{r}}{|rr'|}\right]$$

The total flux at a position produced by the sputtering target at position r' on the substrate is given by $$F(r') = \int d\theta Y(\theta) \int r dr \frac{1}{(r-r')^2} I(r)$$

where the radial and angular integrations are over the target surface.

A few examples follow where the code was used in predicting chemical composition gradients and, in one case, experimental data that support and validate computer code prediction. The agreement between the calculated and the experimental data is very good.

Figures 1, 2A, 2B:
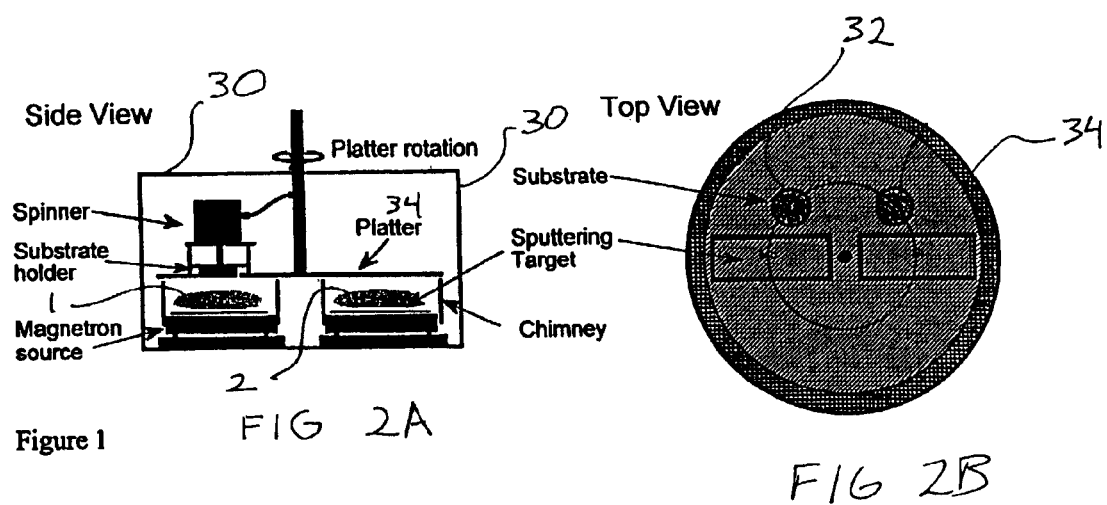
FIG. 2A shows an example deposition system usable in the present invention.
FIG. 2B illustrates a substrate positioned with its face towards the plasma of the sputtering targets and mounted on a rotating platter.

A computer simulation was performed for a magnetron sputtering process with a vertical deposition geometry. An example of the deposition system is shown in FIG. 2A. The magnetron sputtering deposition chamber 30, which is under vacuum, contains two round sputtering targets 1 and 2 that are placed on the bottom of the chamber 30 (FIG. 1A and FIG. 1B). Sputtering target 2 consists of two materials; material A and a strip of material B. As shown in FIG. 2B, substrate 32, which faces down (towards the plasma of the sputtering targets), is mounted on a platter 34 that rotates. The rotation velocity can be modulated and used to control the thickness profile of the multilayer coating, as discussed in the incorporated application. Adjustable parameters in the present computer code are (i) the target erosion profile, which is basically the area on the sputtering target from where the material is sputtered, (ii) the distance between the substrate and the sputtering target, (iii) the strip width of material B and (iv) the offset of the material B from the center of the sputtering target. In the model, the sputtering effluent as (x', y') is proportional to the product of the ion beam current density at (x,y), I(x, y), and a geometrical factor $(\cos^2(\theta)/r^2)$ integrated over the sputtering target.

Figure 3:
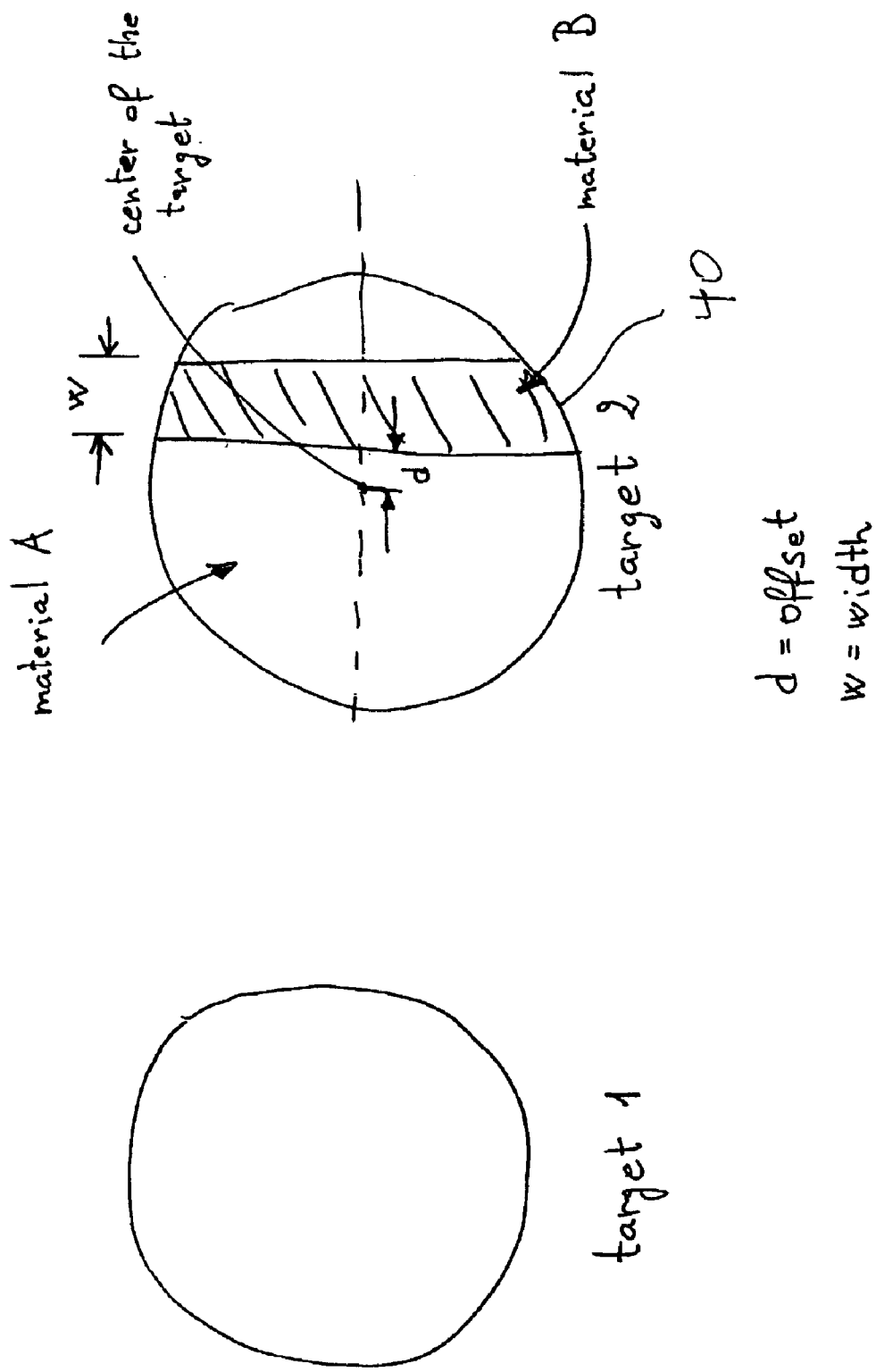
FIG. 3 shows the particular case where the target 2 had a 10 mm wide strip.
Figure 4:
FIG. 4 shows the results of moving the substrate over the target with a constant velocity to create a layer of alloy that is initially rich in one component and then becomes less rich in that component.
Figure 5:
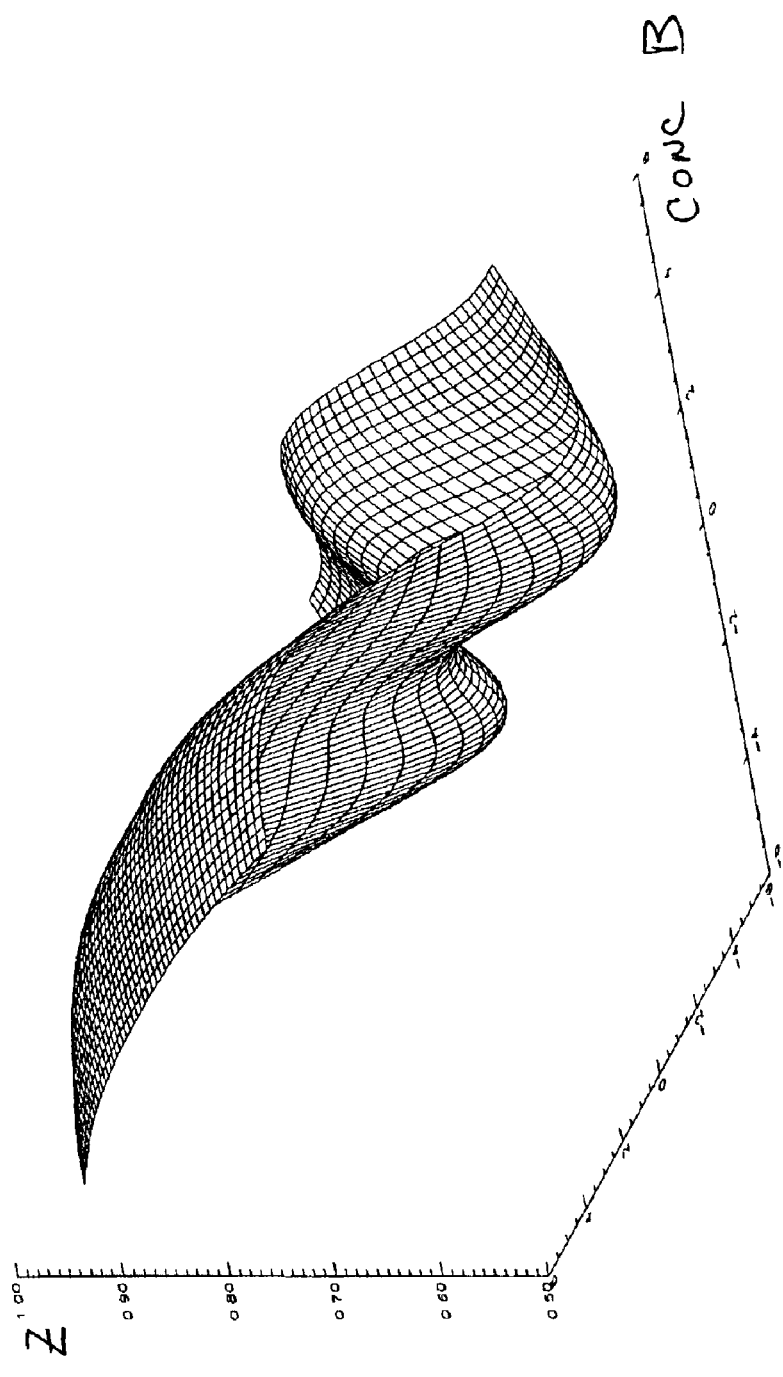
FIG. 5 shows the predicted film composition when using a target that has a strip of material B that is 20 mm wide, 20 mm offset from the center of the target with the substrate is 25 mm above the sputtering target.

Since the sputtering target contains materials A and B, the plasma above the target is also a mixture of both $(A_xB_y)$. If the substrate sits above the sputtering target, the chemical composition of the layer deposited on the substrate is, in first approximation, dependent on the geometry of the sputtering target and the distance to the target FIG. 3 shows the particular case where the target 2 had a 10 mm wide strip 40, which was 20 mm offset and the distance to the target was 65 mm. The code predicted that the film on the substrate would consist of a mixture of $(A_xB_y)$, with B concentration changing from 91% to 69% over 10 cm (a 4" substrate). If instead of placing the substrate above the target, the substrate is moved over the target with a constant velocity, one can create a layer of alloy $(A_xB_y)$ that is initially B rich (e.g., $A_{0.09}B_{0.91}$) and then becomes less B rich (e.g., $A_{0.31}B_{0.69}$) (FIG. 4). A second example (FIG. 5) shows the predicted film composition for a target that has a strip of material B that is 20 mm wide, 20 mm offset from the center of the target with the substrate is 25 mm above the sputtering target. In this case the change in chemical composition is larger. The concentration of B material changes from 24% to 97%. If the substrate moves over the target with a constant velocity such geometry of the target would produce a larger chemical gradient in the layer. The bottom part of the layer would be rich in B ($A_{0.03}B_{0.97}$) and then become B poor ($A_{0.76}B_{0.24}$).

Instead of using a constant velocity, one can also envision a case where the substrate moves with a modulated velocity over the sputtering target (source). This enables thickness and chemical composition control at the same time.

Figure 6:
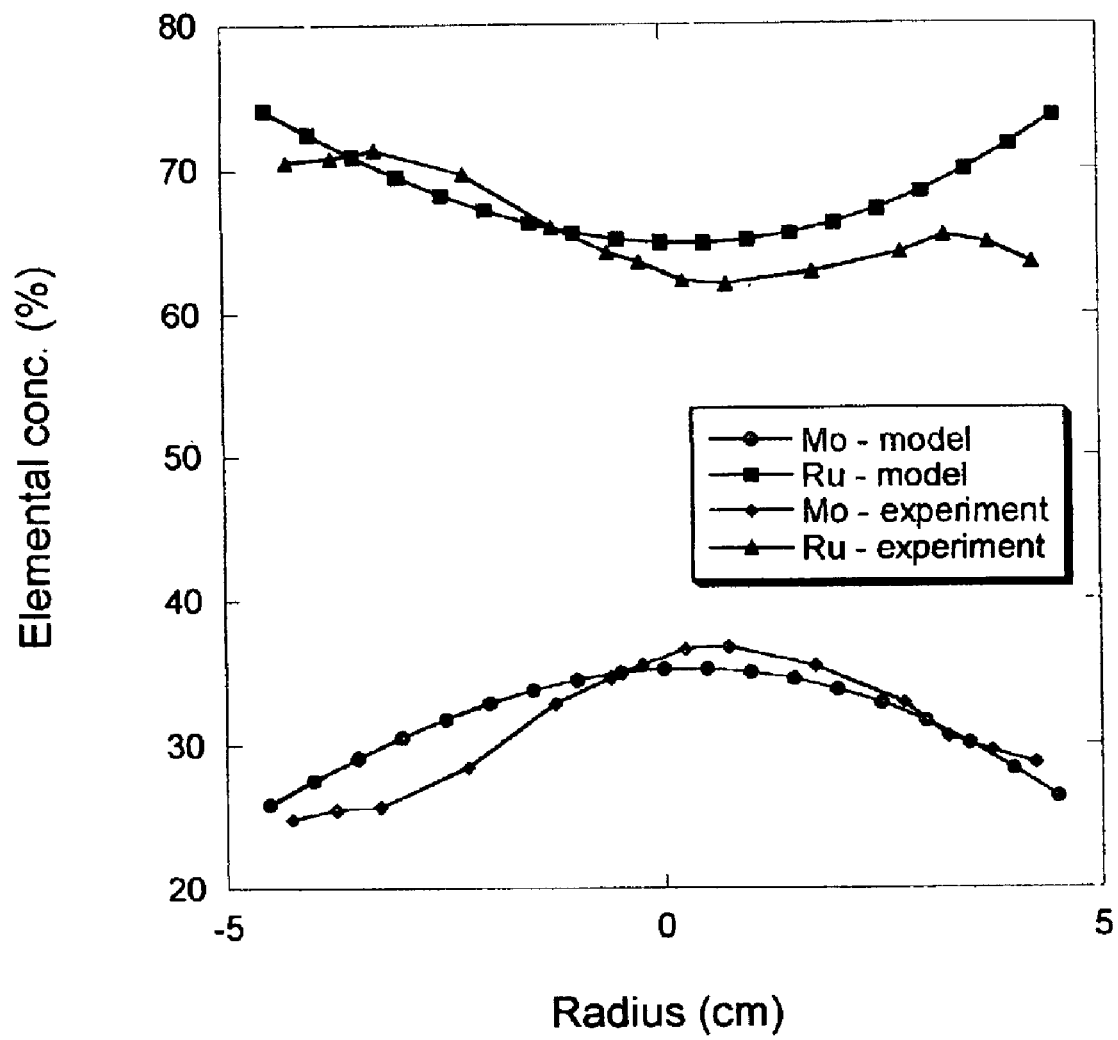
FIG. 6 compares the predicted and measured chemical uniformity of the Mo and Ru concentration in MoRu/Be multilayers.

The invention was used to make chemically uniform $Mo_xRu_{1-x}$ alloy layers in MoRu/Be multilayers. FIG. 6 shows a good agreement between the predicted and measured chemical uniformity of Mo and Ru concentration in MoRu/Be multilayers.

The foregoing description of the invention has been presented for purposes of illustration and description and is not intended to be exhaustive or to limit the invention to the precise form disclosed. Many modifications and variations are possible in light of the above teaching. The embodiments disclosed were meant only to explain the principles of the invention and its practical application to thereby enable others skilled in the art to best use the invention in various embodiments and with various modifications suited to the particular use contemplated. The scope of the invention is to be defined by the following claims.

We claim:

1. A method for fabricating compositionally modulated coatings where the relative concentrations of materials within the coating vary in a prescribed and pre-determined manner, comprising:

specifying the spatial dependence of the composition modulation of the coating to produce a prescribed composition modulation;

selecting an initial design for a sputtering target, wherein said sputtering target comprises a simulated tiled target geometry that includes at least two materials; and performing an iterative design procedure to develop an optimized tiling design of said target for the purpose of preparing the prescribed compositionally modulated coating.

2. The method of claim 1, wherein the step of selecting an initial design for the sputtering target comprises:

selecting the size and shape of a first tile that contains a first material and occupies a first portion of the sputtering target; and selecting the size and shape of a second tile that contains a second material and occupies a second portion of the sputtering target.

3. The method of claim 1, wherein the step of performing an iterative design procedure comprises:

calculating the spatial dependence of the coating composition that would be produced by said initial design to produce simulation results;

comparing said simulation results to said prescribed composition modulation; and modifying said initial target design to improve the agreement between said simulation results and said prescribed composition modulation.

4. The method of claim 1, wherein said compositionally modulated coating comprises at least one uniform alloy layer.

5. The method of claim 1, wherein said compositionally modulated coating comprises at least one chemically graded alloy layer.

6. The method of claim 1, wherein said compositionally modulated coating comprises at least one chemically non-uniform layer.

7. The method of claim 1, further comprising fabricating said compositionally modulated coating.

8. The method of claim 7, wherein the step of fabricating said compositionally modulated coating is carried out using a deposition process selected from the group consisting of physical vapor deposition, chemical vapor deposition and magnetron sputter deposition.

9. The method of claim 7, further comprising controlling chemical composition in either or both the vertical (growth) direction as well as in the horizontal (lateral) direction.

10. The method of claim 1, further comprising providing relative substrate-target motion.

11. The method of claim 7, further comprising modulating the velocity of said substrate over said target.

12. The method of claim 11, wherein said compositionally modulated coating comprises a multilayer reflective coating.

13. An apparatus for designing a sputtering target for fabricating films with chemically modulated composition, comprising computer software implemented in computer hardware, wherein said software numerically integrates over a sputtering target comprising a simulated target geometry to calculate the chemical composition and deposition rate of sputtered effluent from said target within a region of space used to coat a substrate, compares predicted chemical composition with a desired chemical composition and modulates said simulated target geometry in an interative process until a desired chemical composition gradient is obtained, thereby indicating an optimum design for a sputtering target.

14. The apparatus of claim 13, wherein said software tracks the relative position of each point on said substrate relative to said sputtering target and integrate both over said sputtering target and a substrate trajectory to compute the chemical composition of the film as a function of the position on the substrate and the film thickness.

15. The apparatus of claim 13, wherein said iterative process sequentially adjusts target geometry and substrate equation of motion to improve the correspondence between simulation predictions and desired composition gradients to select said optimum design.

16. The apparatus of claim 13, further comprising means for fabricating said films with chemically modulated composition.

17. The apparatus of claim 13, wherein said films are selected from the group consisting of a uniform alloy layer, a chemically graded alloy layer, and a chemically non-uniform layer.

18. The apparatus of claim 13, wherein said means include a deposition system selected from the group consisting of a physical vapor deposition system a chemical vapor deposition system and a magnetron sputter deposition system.

19. The apparatus of claim 13, wherein said film comprise a multilayer reflective coating.

* * * * *